US007994708B2

(12) United States Patent  (10) Patent No.: US 7,994,708 B2
Choi et al.  (45) Date of Patent: Aug. 9, 2011

(54) ORGANIC LIGHT EMITTING DEVICE (75) Inventors: Beohm-Rock Choi, Seoul (KR);
Sang-Woo Lee, Hwaseong-si (KR);
Un-Cheol Sung, Anyang-si (KR);
Jung-Soo Rhee, Seoul (KR);
Young-Rok Song, Yongin-si (KR);
Jung-Yeon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 388 days.

(21) Appl. No.: 12/260,955

(22) Filed: Oct. 29, 2008

(65) Prior Publication Data
US 2009/0261713 A1 Oct. 22, 2009

(30) Foreign Application Priority Data

Apr. 18, 2008 (KR) ........................ 10-2008-0036222

(51) Int. Cl.
*H01J 63/04* (2006.01)
(52) U.S. Cl. ....................................................... 313/504
(58) Field of Classification Search ........... 313/500–505
See application file for complete search history.

(56) References Cited

U.S. PATENT DOCUMENTS

| | | | | |
|---|---|---|---|---|
| 2005/0280008 | A1* | 12/2005 | Ricks et al. | 257/79 |
| 2007/0096636 | A1* | 5/2007 | Park et al. | 313/503 |
| 2007/0126939 | A1* | 6/2007 | Jung et al. | 349/1 |
| 2007/0252522 | A1* | 11/2007 | Kondakov et al. | 313/506 |
| 2008/0135804 | A1* | 6/2008 | Qiu et al. | 252/301.16 |

FOREIGN PATENT DOCUMENTS

| | | |
|---|---|---|
| JP | 11-204264 | 7/1999 |
| JP | 2001-284042 | 10/2001 |
| JP | 2002-246186 | 8/2002 |
| JP | 2004-087217 | 3/2004 |
| JP | 2006-344869 | 12/2006 |
| JP | 2007-080906 | 3/2007 |
| KR | 2003-0010136 | 2/2003 |
| KR | 2005-0082644 | 8/2005 |
| KR | 2005-0082652 | 8/2005 |

\* cited by examiner

*Primary Examiner* — Joseph L Williams
*Assistant Examiner* — Brenitra M Lee
(74) *Attorney, Agent, or Firm* — Innovation Counsel LLP

(57) ABSTRACT

An organic light emitting device according to an exemplary embodiment of the present invention includes: a substrate; a first signal line and a second signal line formed on the substrate and intersecting each other; a common voltage line formed on the substrate, and intersecting one of the first signal line and the second signal line; a switching thin film transistor connected to the first signal line and the second signal line; a driving thin film transistor connected to the switching thin film transistor; an insulating layer covering the first signal line, the second signal line, the switching thin film transistor, and the driving thin film transistor; a pixel electrode formed on the insulating layer, and electrically connected to the driving thin film transistor; an organic light emitting member formed on the pixel electrode and including an emission layer and a member layer; and a common electrode formed on the organic light emitting member, wherein the member layer is made of a plurality of layers including electrons or holes, and at least one layer of the member layer is disposed between the common voltage line and the common electrode to electrically connect between the common voltage line and the common electrode.

19 Claims, 9 Drawing Sheets

ORGANIC LIGHT EMITTING DEVICE

CROSS-REFERENCE TO RELATED APPLICATION

This application claims priority to and the benefit of Korean Patent Application No. 10-2008-0036222 filed in the Korean Intellectual Property Office on Apr. 18, 2008, the entire contents of which are incorporated herein by reference.

BACKGROUND OF THE INVENTION (a) Field of the Invention

The present invention relates to an organic light emitting device.

(b) Description of the Related Art

The organic light emitting device includes an organic light emitting element and a plurality of thin film transistors to drive it. The thin film transistors are made of a plurality of thin films and are generally disposed at the lower side of the organic light emitting device, the organic light emitting element is disposed at the upper side thereof, and an anode of the organic light emitting element is disposed at the lower side and a cathode thereof is disposed at the upper side.

The organic light emitting device may be divided into a top emission type that emits light to the upper side and a bottom emission type that emits light to the lower side. In the case of the bottom emission type, the thin film transistors are disposed under the organic light emitting element such that the area where the light is emitted is decreased, and accordingly it is advantageous to apply the top emission type with regard to the aperture ratio. Also, in the bottom emission type, spots may be generated due to optical interference generated when the light passes through the thin films, but the thin films exist in a minor amount on the path where the light passes such that the possibility thereof is slim.

In the case of the top emission type, since there is no transparent material satisfying the work function condition required as the cathode, an opaque metal material is very thinly deposited to be used as the cathode, thereby allowing the light to pass. However, resistance of the cathode is increased in this case such that an additional common voltage line for transmitting a common voltage on a substrate is needed, and the cathode of the organic light emitting element is connected to the common voltage line.

However, when the common voltage line is formed separately from the cathode, an emitting member between the cathode and the common voltage line must be removed such that the manufacturing process becomes complicated.

The above information disclosed in this Background section is only for enhancement of understanding of the background of the invention and therefore it may contain information that does not form the prior art that is already known in this country to a person of ordinary skill in the art.

SUMMARY OF THE INVENTION

An organic light emitting device according to an exemplary embodiment of the present invention includes: a substrate; a first signal line and a second signal line formed the substrate and intersecting each other; a common voltage line formed on the substrate, and intersecting one of the first signal line and the second signal line; a switching thin film transistor connected to the first signal line and the second signal line; a driving thin film transistor connected to the switching thin film transistor; an insulating layer covering the first signal line, the second signal line, the switching thin film transistor, and the driving thin film transistor; a pixel electrode formed on the insulating layer, and electrically connected to the driving thin film transistor; an organic light emitting member formed on the pixel electrode and including an emission layer and a member layer; and a common electrode formed on the organic light emitting member, wherein the member layer is made of a plurality of layers including electrons or holes, and at least one layer of the member layer is disposed between the common voltage line and the common electrode to electrically connect between the common voltage line and the common electrode.

The organic light emitting device may further include contact assistants formed on the insulating layer and directly contacting the common voltage line through a contact hole of the insulating layer, and a partition formed between the common electrode and the contact assistants and having a contact hole exposing the contact assistants. The member layer for electrically connecting between the common voltage line and the common electrode may also be formed in the contact hole of the partition to be electrically connected to the contact assistants.

The member layer for electrically connecting between the common voltage line and the common electrode may be formed under the whole of the common electrode.

The member layer may include an electron injection layer, an electron transport layer, a hole transport layer, and a hole injection layer, the thickness of the electron injection layer is in the range of 5-10 Å and it includes a first electron injection layer made of LiF, and the member layer for electrically connecting between the common voltage line and the common electrode may include the first electron injection layer.

The electron injection layer may include a second electron injection layer including a metal oxide or an organic material having a deposition speed ratio of 1-20% of the electron injection layer, and the member layer for electrically connecting between the common voltage line and the common electrode may include the second electron injection layer.

The metal oxide may include at least one of vanadium oxide $V_2O_5$), tungsten oxide ($WO_3$) or molybdenum oxide ($MoO_3$), and the organic material may be made of tetrafluoro-tetracyano-p-quinodimethane (F4-TCNQ).

The hole injection layer may include an alkali metal or an organic material having a deposition speed ratio of 1-20% of the hole injection layer, and the member layer for electrically connecting between the common electrode may include the hole injection layer.

The alkali metal may be at least one of Li, Cs, and Mg, and the organic material may be $C_{60}$.

The hole transport layer may include an alkali metal or an organic material having a deposition speed ratio of 1-20% of the hole transport layer, the member layer for electrically connecting between the common electrode may include the hole transport layer, and the electron transport layer may have different thicknesses in a red emission region, a green emission region, and a blue emission region.

The alkali metal may be at least one of Li, Cs, and Mg, and the organic material may be $C_{60}$.

The electron transport layer may include a metal oxide or an organic material having a deposition speed ratio of 1-20% of that of the electron transport layer, the member layer for electrically connecting between the common electrode may include the electron transport layer, and the hole transport layer may have different thicknesses in a red emission region, a green emission region, and a blue emission region.

The metal oxide may include at least one of vanadium oxide ($V_2O_5$), tungsten oxide ($WO_3$), or molybdenum oxide (MoO$_3$), and the organic material may be made of tetrafluoro-tetracyano-p-quinodimethane (F4-TCNQ).

The member layer may include an electron transport layer, a hole transport layer, and a hole injection layer, the hole injection layer may include an alkali metal or an organic material having a deposition speed ratio of 1-20% of the hole transport layer, and the member layer for electrically connecting between the common electrode may include the hole injection layer.

The hole transport layer may include an alkali metal or an organic material having a deposition speed ratio of 1-20% of the hole transport layer, the member layer for electrically connecting between the common electrode may include the hole transport layer, and the electron transport layer may have different thicknesses in a red emission region, a green emission region, and a blue emission region.

The electron transport layer may include a metal oxide or an organic material having a deposition speed ratio of 1-20% of the electron transport layer, the member layer for electrically connecting between the common electrode may include the electron transport layer, and the hole transport layer may have different thicknesses in a red emission region, a green emission region, and a blue emission region.

The member layer may include an electron transport layer and a hole transport layer, the hole transport layer includes an alkali metal or an organic material having a deposition speed ratio of 1-20% of the hole transport layer, the member layer for electrically connecting between the common electrode may include the hole transport layer, and the electron transport layer may have different thicknesses in a red emission region, a green emission region, and a blue emission region.

The member layer may include an electron transport layer and a hole transport layer, the electron transport layer includes a metal oxide or an organic material having a deposition speed ratio of 1-20% of the electron injection layer, the member layer for electrically connecting between the common electrode may include the electron transport layer, and the hole transport layer may have different thicknesses in a red emission region, a green emission region, and a blue emission region.

The pixel electrode may include a transparent electrode made of a transparent conductive material and a reflecting electrode made of a reflective conductive material.

The common electrode may have a thickness of 50-100 Å.

DETAILED DESCRIPTION OF THE EMBODIMENTS

The present invention will be described more fully hereinafter with reference to the accompanying drawings, in which exemplary embodiments of the invention are shown.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, an organic light emitting device according to an embodiment of the present invention will be described in detail with reference to FIG. 1.

Figure 1:
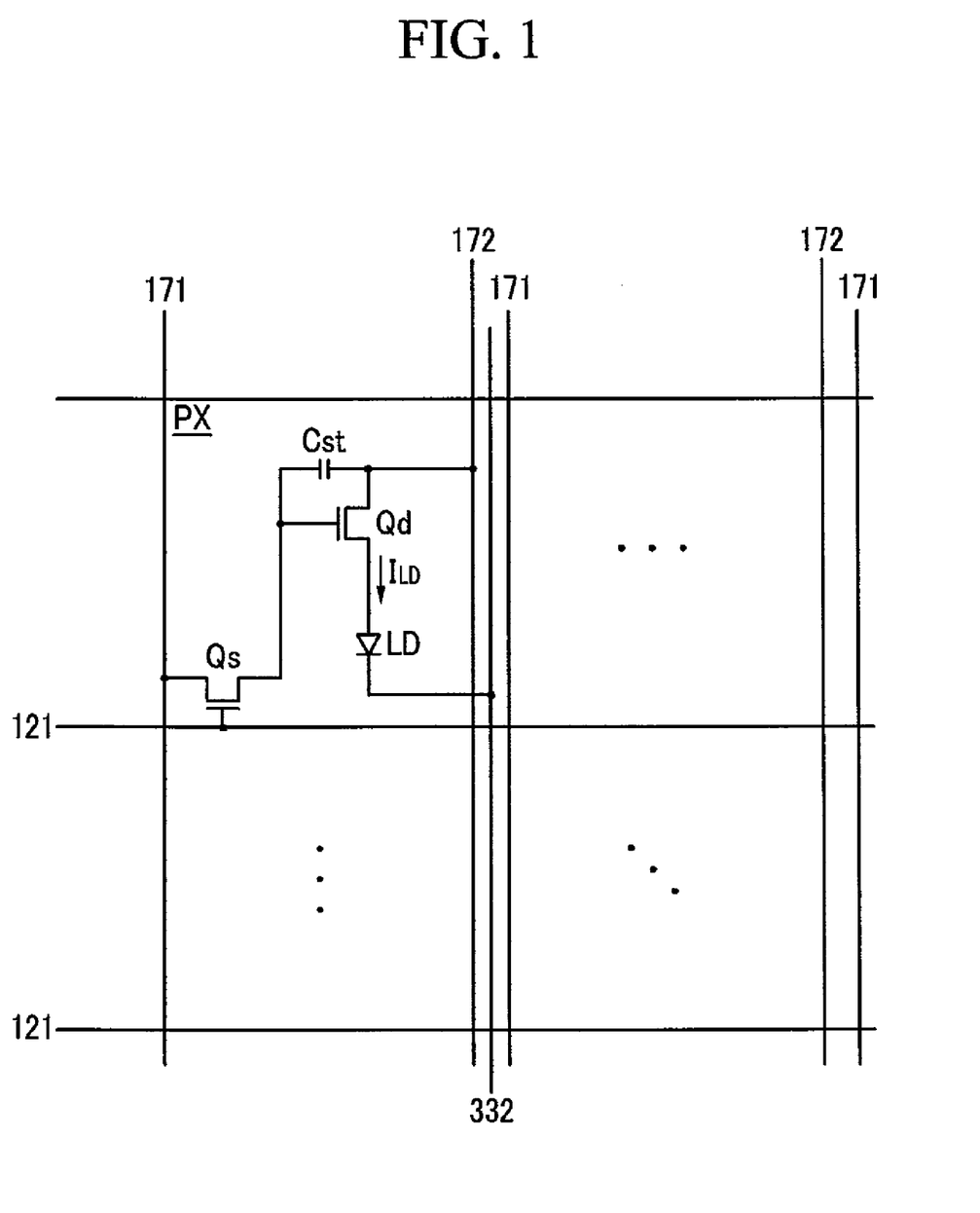
FIG. 1 is an equivalent circuit diagram of an organic light emitting device according to an exemplary embodiment of the present invention.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, 172, and 332, and a plurality of pixels PX connected thereto and arranged substantially in a matrix.

The signal lines include a plurality of gate lines 121 for transmitting gate signals (or scanning signals), a plurality of data lines 171 for transmitting data signals, a plurality of driving voltage lines 172 for transmitting a driving voltage, and a plurality of common voltage lines 332 for transmitting a common voltage. The gate lines 121 extend substantially in a row direction and substantially parallel to each other, and the data lines 171 extend substantially in a column direction and substantially parallel to each other. The driving voltage lines 172 extend substantially in the column direction, and the common voltage lines 332 also extend substantially in the column direction, but may extend in the row direction.

Each pixel PX includes a switching transistor Qs, a driving transistor Qd, a storage capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits a data signal applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current $I_{LD}$ having a magnitude depending on the voltage between the control terminal and the output terminal.

The storage capacitor Cst is connected between the control terminal and the input terminal of the driving transistor Qd. The storage capacitor Cst stores a data signal applied to the control terminal of the driving transistor Qd and maintains the data signal after the switching transistor Qs turns off.

The organic light emitting element LD as an organic light emitting diode (OLED) has an anode connected to the output terminal of the driving transistor Qd and a cathode connected to a common voltage line 332. The organic light emitting element LD emits light having an intensity depending on an output current ILD of the driving transistor Qd, thereby displaying images.

The switching transistor Qs and the driving transistor Qd are n-channel field effect transistors (FETs), and at least one may have the structure shown in FIG. 1. However, at least one of the switching transistor Qs and the driving transistor Qd may be a p-channel FET. In addition, the connections among the transistors Qs and Qd, the capacitor Cst, and the organic light emitting element LD may be modified.

According to the case, other transistors for compensating the threshold voltage of the driving transistor Qd or the organic light emitting element LD may be further included, as well as the switching transistor Qs and the driving transistor Qd.

Now, the structure of the organic light emitting device shown in FIG. 1 will be described in detail with reference to FIG. 2 to FIG. 4 as well as FIG. 1.

Figure 2:
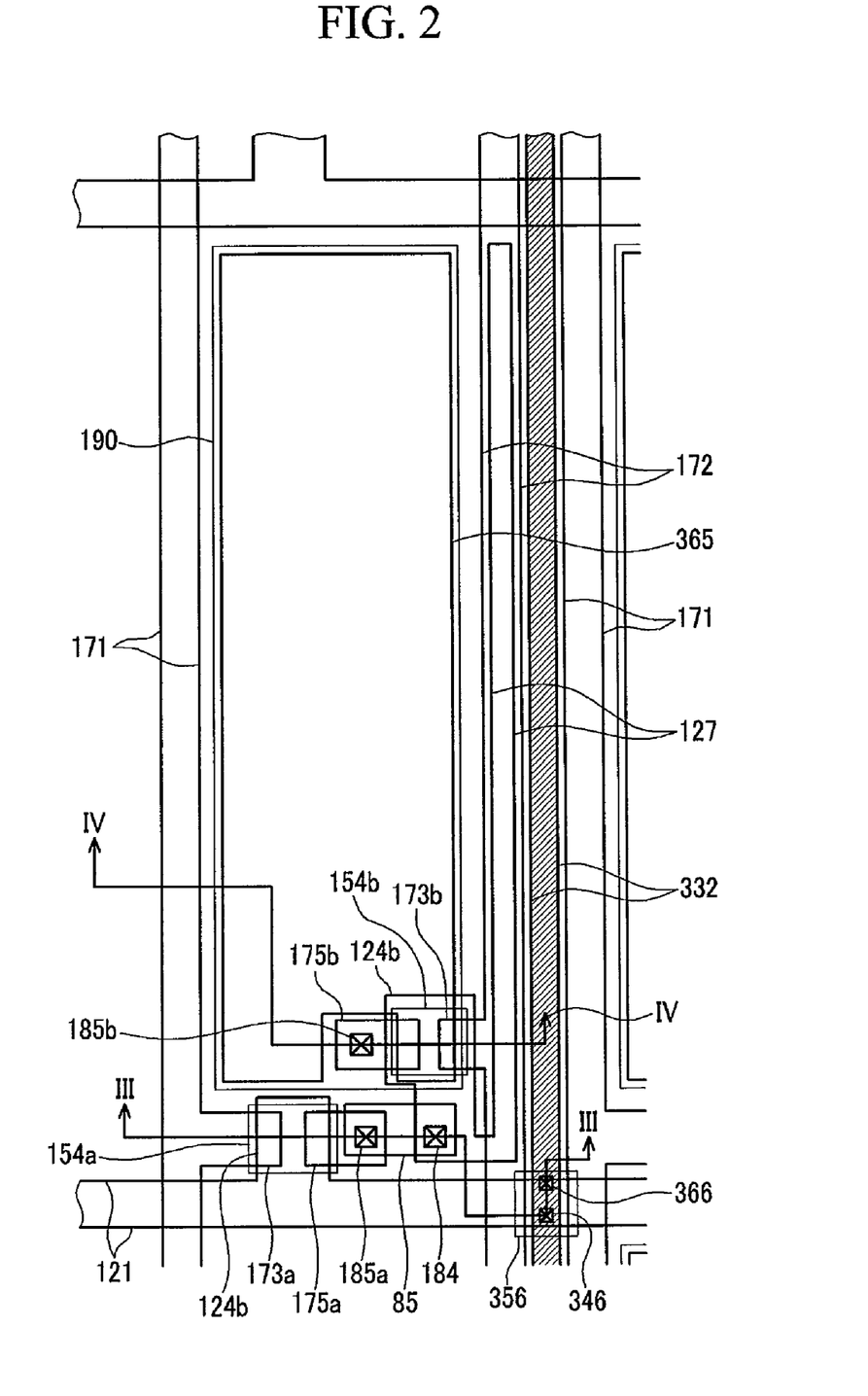
FIG. 2 is a layout view of an organic light emitting device according to an exemplary embodiment of the present invention.
Figure 3:
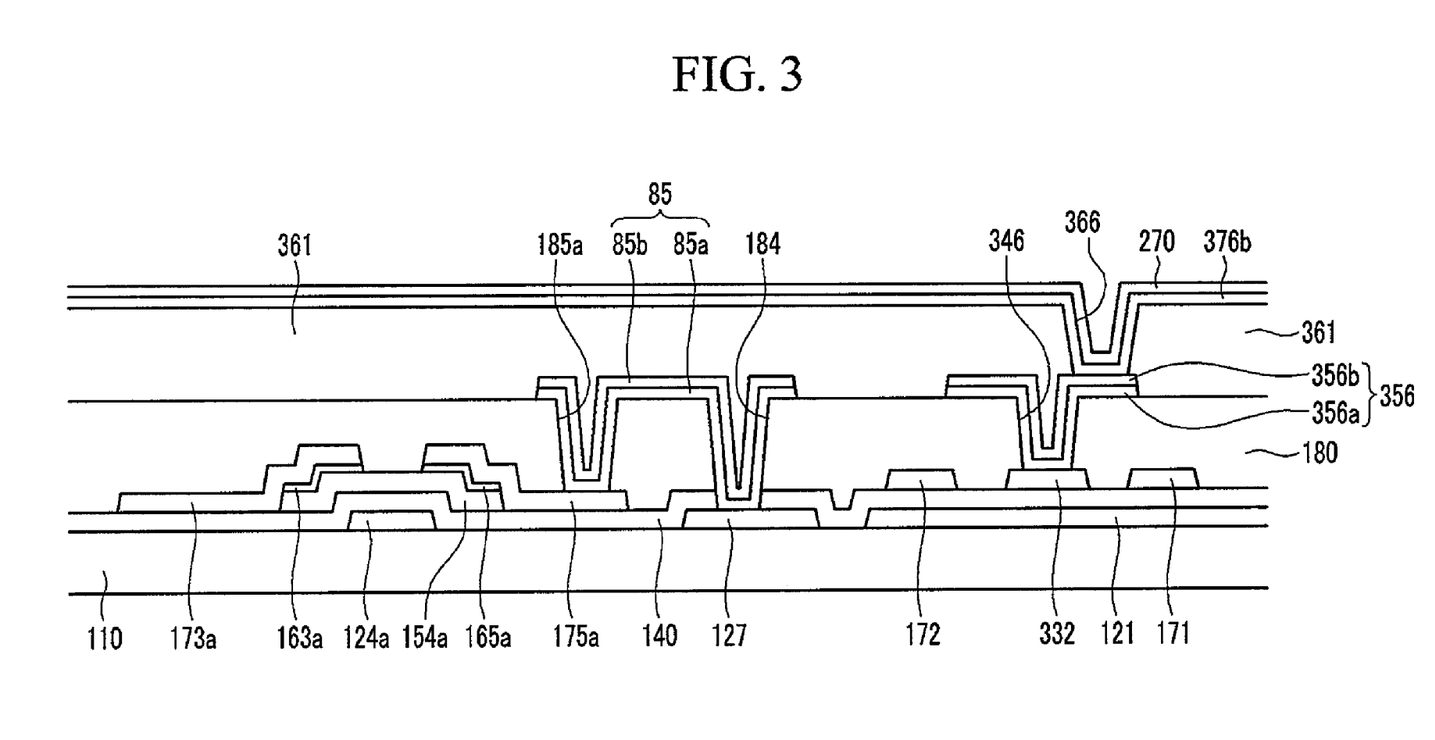
FIG. 3 is a cross-sectional view of the organic light emitting device shown in FIG. 2 taken along the line III-III.
Figure 4:
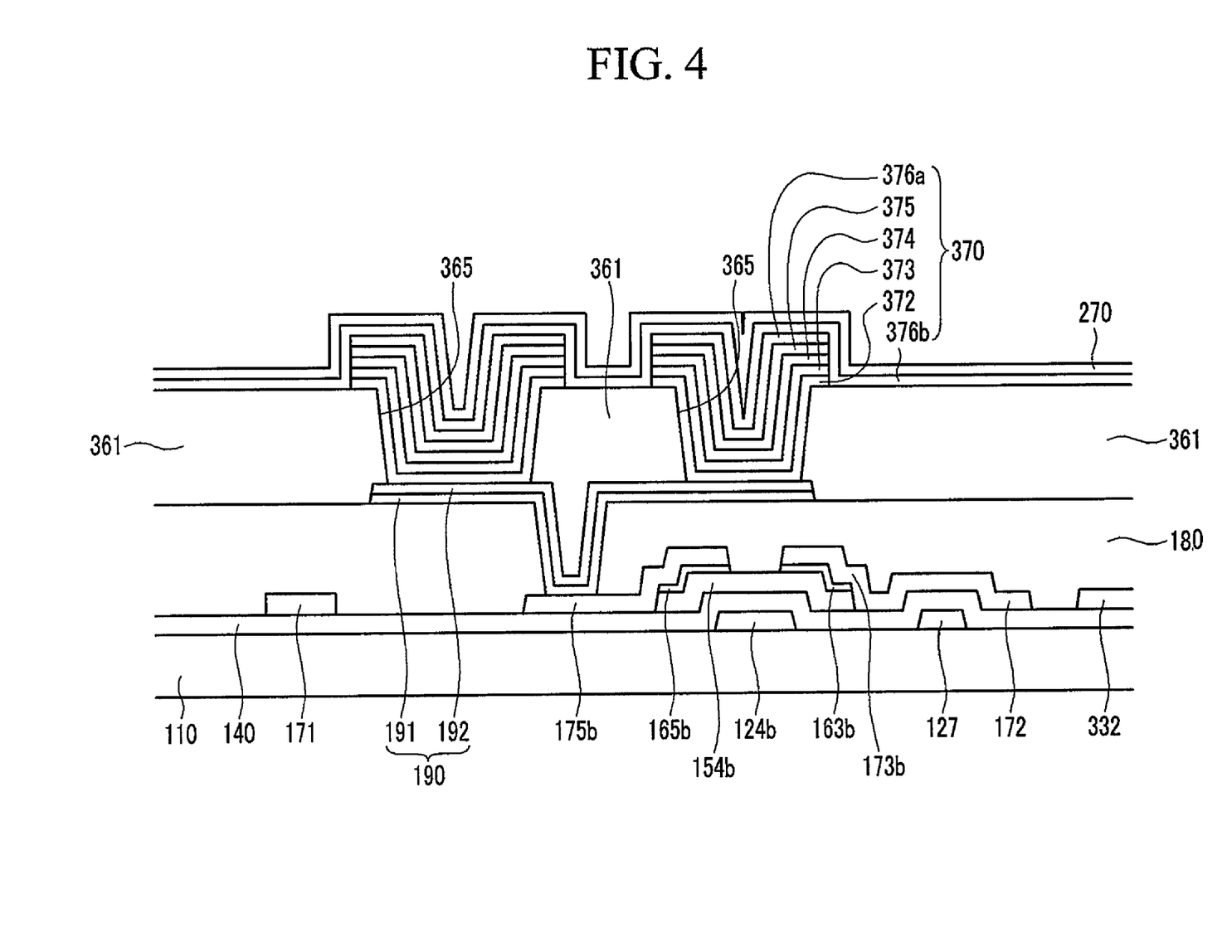
FIG. 4 is a cross-sectional view of the organic light emitting device shown in FIG. 2 taken along the line IV-IV.

FIG. 2 is a layout view of an organic light emitting device according to an exemplary embodiment of the present invention, FIG. 3 is a cross-sectional view of one example of the organic light emitting device shown in FIG. 2 taken along the line III-III, and FIG. 4 is a cross-sectional view of another example of the organic light emitting device shown in FIG. 2 taken along the line IV-IV.

Referring to FIGS. 2 to 4, a plurality of gate lines 121 including a plurality of first control electrodes 124a and a plurality of second control electrodes 124b are formed on an insulating substrate 110 made of a material such as transparent glass or plastic.

The gate lines 121 are substantially extended in the transverse direction, and the first control electrodes 124a are protruded upward. Each gate line 121 includes an end portion (not shown) having a large area for contact with another layer or an external driving circuit.

The second control electrodes 124b are separated from the gate lines 121 and include a plurality of storage electrodes 127 extending in a longitudinal direction.

A gate insulating layer 140 preferably made of silicon oxide or silicon nitride is formed on the gate lines and the second control electrodes 124b.

A plurality of first and second semiconductor islands 154a and 154b preferably made of hydrogenated amorphous silicon are formed on the gate insulating layer 140. The first semiconductor islands 154a are disposed on the first control electrodes 124 and the second semiconductor islands 154b are disposed on the second control electrodes 124b.

A plurality of pairs of first ohmic contacts 163a and 165a are formed on the first semiconductor islands 154a, and a plurality of pairs of second ohmic contacts 163b and 165b are formed on the second semiconductor islands 154b. The ohmic contacts 163a, 163b, 165a, and 165b have an island shape, and are made of a material such as n+hydrogenated amorphous silicon that is heavily doped with an n-type impurity such as phosphorus.

A plurality of data lines 171, a plurality of driving voltage lines 172, a plurality of common voltage lines 332, and a plurality of first and second output electrodes 175a and 175b are formed on the ohmic contacts 163a, 163b, 165a, and 165b, and on the gate insulating layer 140.

The data lines 171, the common voltage lines 332 and the driving voltage lines 172 extend in the longitudinal direction while intersecting the gate lines 121. The data lines 171 include first input electrodes 173a extending toward the first control electrodes 124a, and the driving voltage lines 172 include second input electrodes 173b extending toward the second control electrodes 124b.

The first and second output electrodes 175a and 175b are separated from each other, as are the data lines 171 and the driving voltage lines 172. The first input electrodes 173a and the first output electrodes 175a are opposite to each other with respect to the first control electrodes 124a, and the second input electrodes 173b and the second output electrodes 175b are opposite to each other with respect to the second control electrodes 124b.

The ohmic contacts 163a, 163b, 165a, and 165b are disposed between the semiconductor islands 154a and 154b thereunder and the overlaying data lines 171, the driving voltage lines 172, and the output electrodes 175a, and 175b.

The first control electrode 124a, the first input electrode 173a, and the first output electrode 175a form a switching thin film transistor (TFT) Qs along with the first semiconductor island 154a, and the second control electrode 124b, the second input electrode 173b and the second output electrode 175b form a driving thin film transistor Qd along with the second semiconductor island 154b.

The structures of the above-described switching thin film transistor Qs, the driving thin film transistor Qd, the gate line 121, the data line 171, and the driving voltage line 172 are exemplary, and various other examples may be proposed.

The common voltage lines 332 are applied with the common voltage and extend in the longitudinal direction according to the data lines 171. The common voltage lines 332 may be formed with the same layer as the gate lines 121 according to the gate lines 121, and may be formed as a separated layer from the gate lines 121 or the data lines 171 or may be formed according to the gate lines 121 or the data lines 171.

A passivation layer 180 is formed on the data lines 171, the driving voltage lines 172, the output electrodes 175a and 175b, the common voltage lines 332, and the exposed semiconductor islands 154a and 154b. The passivation layer 180 includes a lower layer (not shown) preferably made of an inorganic insulator such as silicon nitride or silicon oxide, and an upper layer (not shown) preferably made of an organic insulator. The organic insulator may have a dielectric constant of less than 4.0, and it may have photosensitivity and a flat surface. The passivation layer 180 may have a single-layered structure as an inorganic insulator, or as an organic insulator.

The passivation layer 180 has a plurality of contact holes 185a and 185b exposing the output electrodes 175a and 175b, and the passivation layer 180 and the gate insulating layer 140 have a plurality of contact holes 184 and 346 exposing the second control electrodes 124b and the common voltage lines 332.

A plurality of pixel electrodes 190, a plurality of contact assistants 356, and a plurality of connecting members 85 are formed on the passivation layer 180.

The pixel electrodes 190 may have a double structure including a reflecting electrode 191 made of aluminum, silver, chromium, or an alloy thereof, and a transparent electrode 192 made of ITO or IZO. The deposition sequence of the reflecting electrode 191 and the transparent electrode 192 forming the pixel electrode 190 may be interchanged.

To form the pixel electrodes 190, two metal layers may be deposited and simultaneously patterned, and here the contact assistants 356 and the connecting members 85 may have double layers 356a and 356b, and 85a and 85b, like the pixel electrodes 190.

However, when respectively patterning the reflecting electrode 191 and the transparent electrode 192, the contact assistants 356 and the connecting members 85 may be made of one among the reflecting electrode 191 or the transparent electrode 192, if necessary. The pixel electrodes 190 are connected to the second output electrodes 175b through the contact holes 185b, and the connecting members 85 are connected to the second control electrodes 124b and the first output electrodes 175a through the contact holes 184 and 185b.

The contact assistants 356 are connected to the common voltage lines 332 through the contact holes 346.

A partition 361 is formed on the reflecting electrode 191, the common voltage lines 332, the connecting members 85, and the passivation layer 180. The partitions 361 define a plurality of openings 365 enclosing edges of the pixel electrodes 191 like a bank, and include a plurality of contact holes 366 exposing the contact assistants 356. The partition 361 may be made of an organic insulator or an inorganic insulator, it may be particularly made of a photosensitive material including a black pigment, and the partition 361 functions as a light blocking member, and the manufacturing process may be simplified in this case.

A plurality of organic light emitting members 370 are formed in the openings 365 defined by the partition 361 on the pixel electrode 190. The organic light emitting members 370 are made of a multi-layered structure including an emission layer 374 and auxiliary layers 372, 373, 375, and 376 for enhancing the efficiency of the emission layer 374.

The emission layer 374 is preferably made of an organic material uniquely emitting light of one primary color such as of three primary colors of red, green, and blue, or a mixture of the organic material and the inorganic material. The organic light emitting device may also display desired images by spatially combining the colored light of the primary colors emitted by the emission layer 374.

The auxiliary layers 372, 373, 375, and 376 include a hole transport layer 373 and an electron transport layer 375 for controlling the balance of electrons and holes, and also include an electron injection layer 372 and a hole injection layer 376 for enhancing the injection of electrons and holes.

The hole transport layer 373 and the hole injection layer 372 are made of a material having a mid-work function between the pixel electrodes 190 and the emission layer 374, and the electron transport layer 375 and the electron injection layer 376 are made of a material having a mid-work function between the common electrode 270 and the emission layer 374.

The electron injection layer 376, the electron transport layer 375, and the hole transport layer 373 or the hole injection layer 372 may be omitted if necessary.

The electron injection layer 376 includes a first electron injection layer 376a and a second electron injection layer 376b, however they may be formed as one layer (not shown) if necessary. Here, the first electron injection layer 376a may include at least one material selected from $Alq_3$, lithium fluoride (LiF), lithium quinolate (LiQ), oxadiazole, triazole, and triazine, and the second electron injection layer 376b may include LiF.

The second electron injection layer 376b is formed on the whole surface of the substrate including the organic light emitting member 370, and contacts the contact assistants 356 through the contact holes 386. The second electron injection layer 376b has a thickness of 5-10 Å in one example.

A common electrode 270 is formed on the second electron injection layer 376b on the whole surface of the substrate.

The common electrode 270 may be made of a conductive material that has a good electron injection property and does not affect the organic material such as a transparent conductive material of ITO or IZO, or a non-transparent conductive material. The non-transparent conductive material may be a metal including calcium (Ca), barium (Ba), magnesium (Mg), aluminum, or silver, and may have a thickness of 50-100 Å to pass light therethrough.

Like the present exemplary embodiment, the common voltage lines 332 and the common electrode 270 are connected to each other through the contact assistants 356 such that the resistance of the common electrode 270 may be reduced, and the second electron injection layer 376b is formed at a thickness of 5-10 Å such that the common electrode 270 and the contact assistants 356 are electrically connected to each other successfully.

In the exemplary embodiment of the present invention, the second electron injection layer 376b is formed to have the thickness as above such that the second electron injection layer 376b may be formed on the whole surface of the substrate. Accordingly, an additional process to expose the contact assistants 356 is not necessary, thereby simplifying the manufacturing process.

Figure 5:
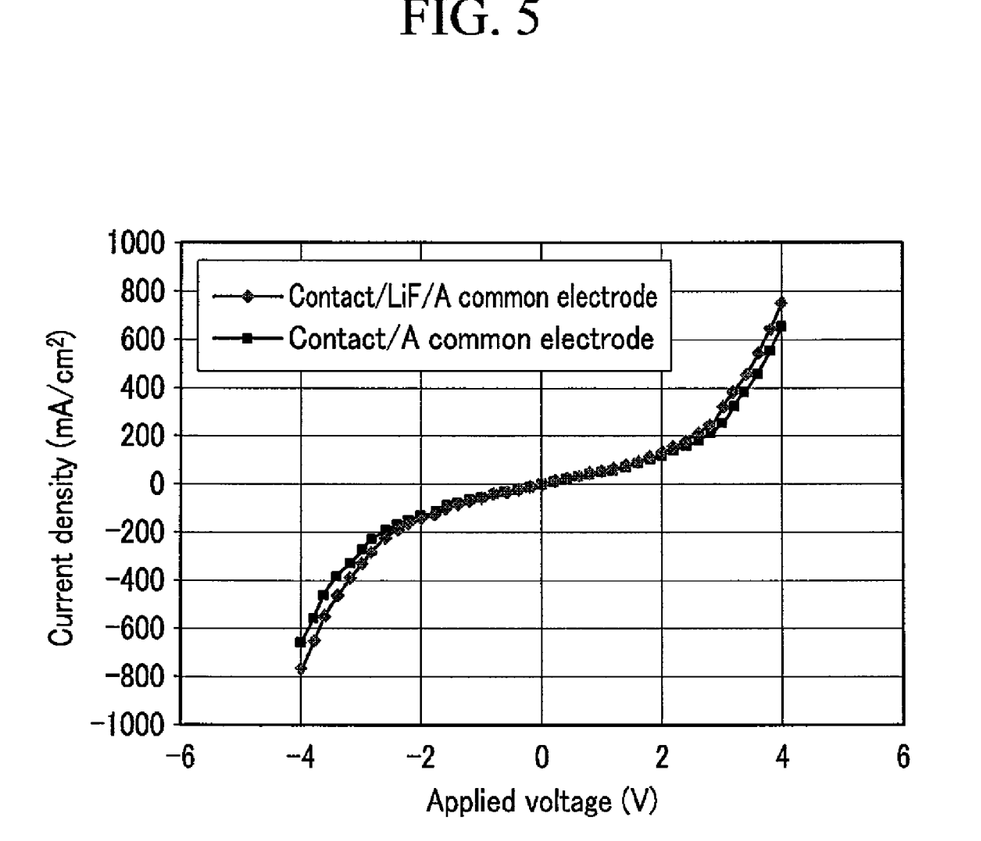
FIG. 5 is a graph showing a V-I curved line according to a conventional art and a V-I curved line according to an exemplary embodiment of the present invention.

FIG. 5 is a graph showing a V-I curved line according to a conventional art and a V-I curved line according to an exemplary embodiment of the present invention.

Referring to FIG. 5, in an exemplary embodiment of the present invention the second electron injection layer 376b is deposited on the whole surface of the substrate to form the interlayer structure of the contact assistants 356/the second electron injection layer 376b/the common electrode 270.

In the organic light emitting device, the pixel electrode 190, the organic light emitting member 370, and the common electrode 270 form the organic light emitting element LD having the pixel electrode 190 as an anode and the common electrode 270 as a cathode.

In the organic light emitting device, the light is emitted on the upper side of the substrate 110 to display the images, and the light emitted from the organic light emitting member 370 to the substrate 110 is reflected by the reflecting electrode 191 and the connecting member 85 and progresses toward the upper side.

Here, at least one surface of the organic light emitting member, the pixel electrode 190, and the common electrode 270 may be controlled to have a microcavity structure for amplifying the wavelength of the emitted color according to the red, green, and blue pixels. In the microcavity structure, the light is repeatedly reflected between the pixel electrode 190 and the common electrode 270 that are apart from each other by an optical length to amplify light of a particular wavelength by constructive interference, and for example the thickness of the hole transport layer 373 may be differently formed in the sequence of red>green>blue to enhance the particular wavelength.

Figure 6:
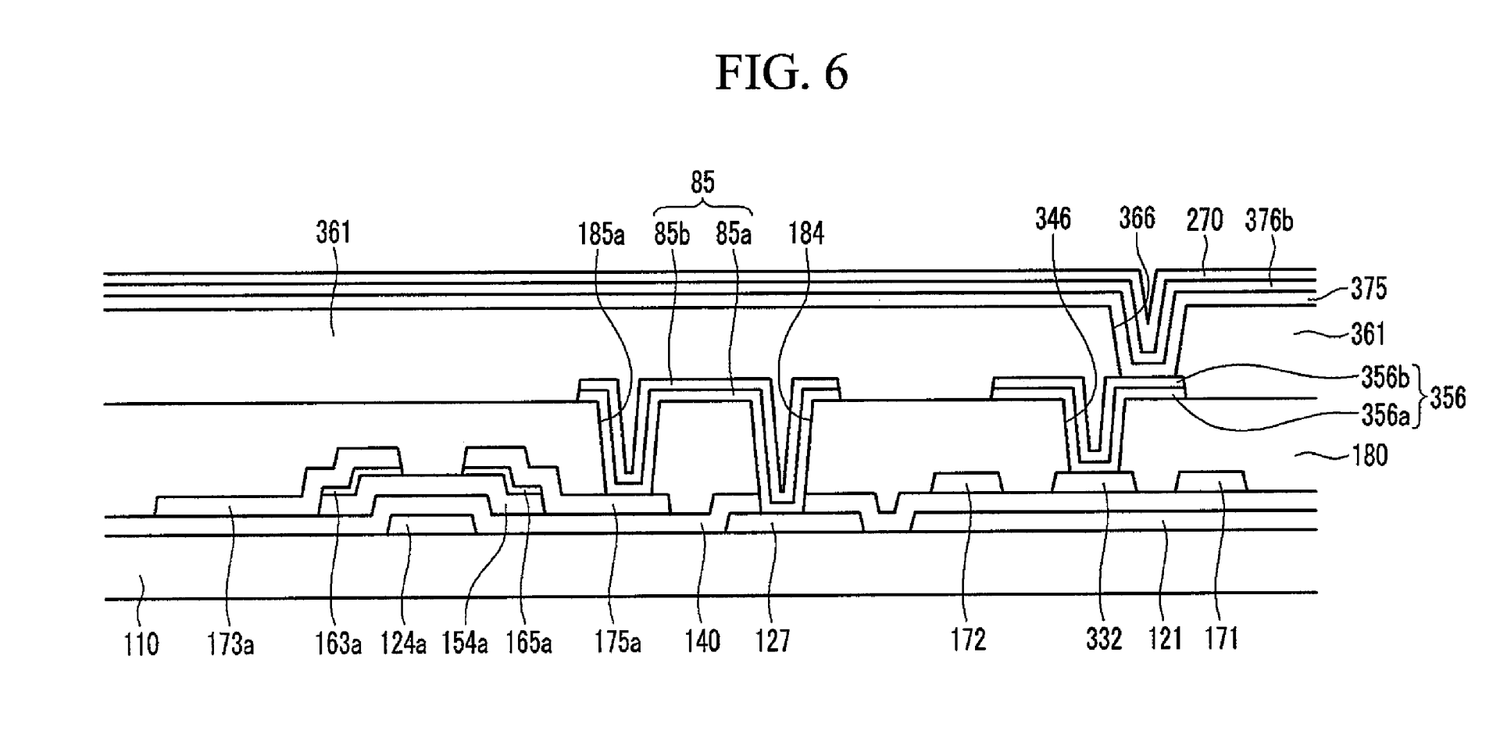
FIG. 6 is a cross-sectional view of an organic light emitting device according to another exemplary embodiment of the present invention and taken along the line III-III of FIG. 2.

FIG. 6 is a cross-sectional view of an organic light emitting device according to another exemplary embodiment of the present invention, and is taken along the line III-III of FIG. 2.

Most of the interlayer structure of the organic light emitting device shown in FIG. 6 is the same as that of the organic light emitting device shown in FIG. 2, such that elements that are different from the organic light emitting device shown in FIG. 2 will be described.

Referring to FIG. 4, an organic light emitting member 370 according to an exemplary embodiment of FIG. 6 of the organic light emitting device includes an emission layer 374 and auxiliary layers 372, 373, 375, and 376.

The emission layer 374 is preferably made of an organic material that uniquely emits light of one primary color such as of three primary colors of red, green, and red, or a mixture of an organic material and an inorganic material. The auxiliary layers 372, 373, 375, and 376 include a hole transport layer 373 and an electron transport layer 375, and an electron injection layer 372 and a hole injection layer 376 for enhancing the injection of electrons and holes.

However, in the exemplary embodiment shown in FIG. 6, the electron transport layer 375 is formed on the whole surface of the substrate as well as on the second electron injection layer 376b. The electron transport layer 375 may be made of the same material as the electron injection layer 376, and may be deposited as a multi-layer if necessary.

Here, the electron transport layer 375 may include at least one of vanadium oxide ($V_2O_5$), tungsten oxide ($WO_3$) or molybdenum oxide ($MoO_3$) as a metal oxide. Also, it may include tetrafluoro-tetracyanoquinodimethane (F4-TCNQ) or NDP (a product of Novaled company) as the organic material. Here, it is preferable that the deposition speed ratio of the metal oxide or the organic material is in the range of 1-20%.

The electron transport layer 375 as a semiconductor material serves as a diode to which a current does not flow under a predetermined voltage. However if the electron transport layer 375 is doped with an impurity like in the present exemplary embodiment, the work function thereof is decreased such that the electron transport layer 375 does not disturb the inflowing current.

Figure 7:
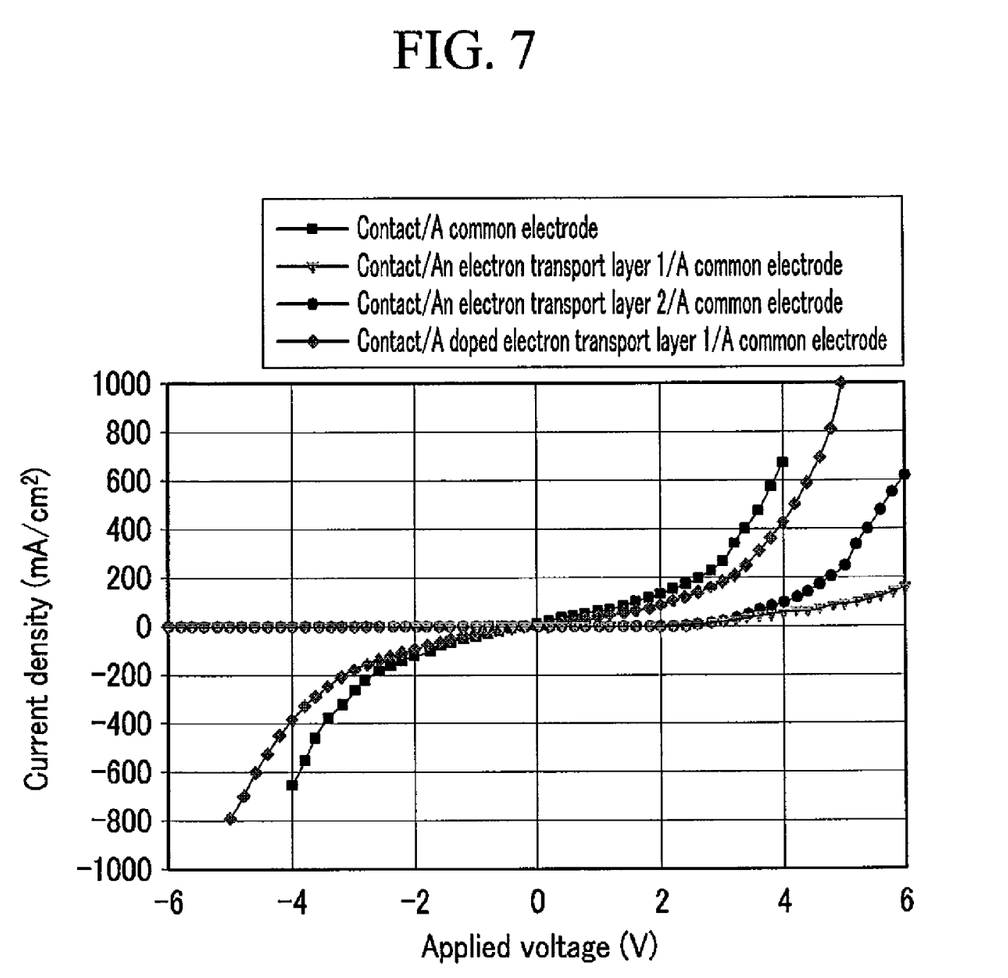
FIG. 7 is a graph showing a V-I curved line of an organic light emitting device according to a conventional art and a V-I curved line of an organic light emitting device according to an exemplary embodiment of the present invention.

FIG. 7 is a graph showing a V-I curved line of an organic light emitting device according to a conventional art and a V-I curved line of an organic light emitting device according to an exemplary embodiment of the present invention.

Referring to FIG. 7, according to the conventional art, when the sequence of contact assistants 356/an electron transport layer 375/a common electrode 270 is deposited, the current does not flow under the predetermined voltage of 0.7V. However, in the exemplary embodiment of the present invention, when the sequence of contact assistants 356/a doped electron transport layer 375/a common electrode 270 is deposited, the same V-I curved line as that found with direct contact of the contact assistants and the common electrode 270 may be obtained.

Figure 8:
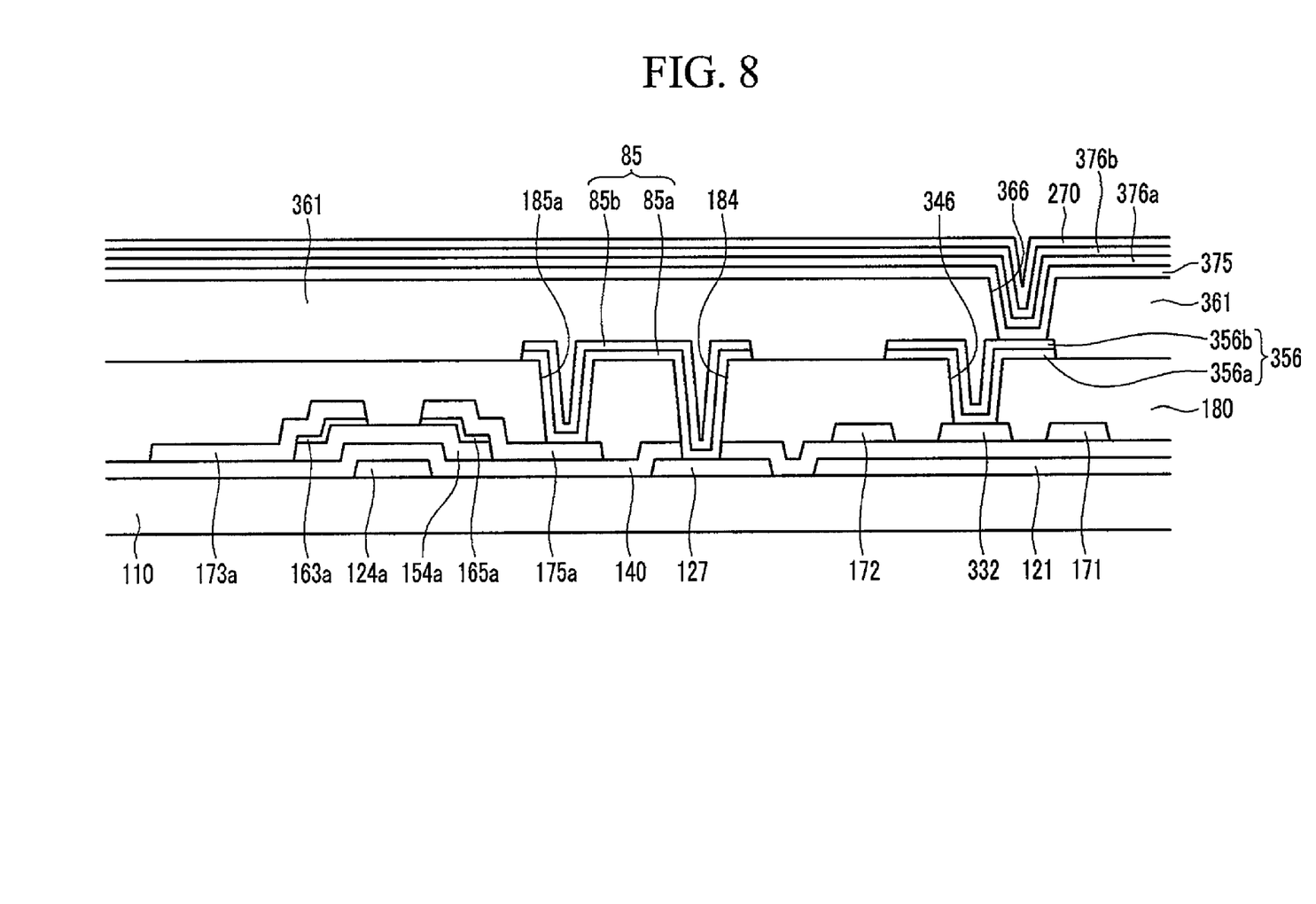
FIG. 8 to FIG. 9 are cross-sectional views of an organic light emitting device according to another exemplary embodiment of the present invention and taken along the line III-III of FIG. 2.
Figure 9:
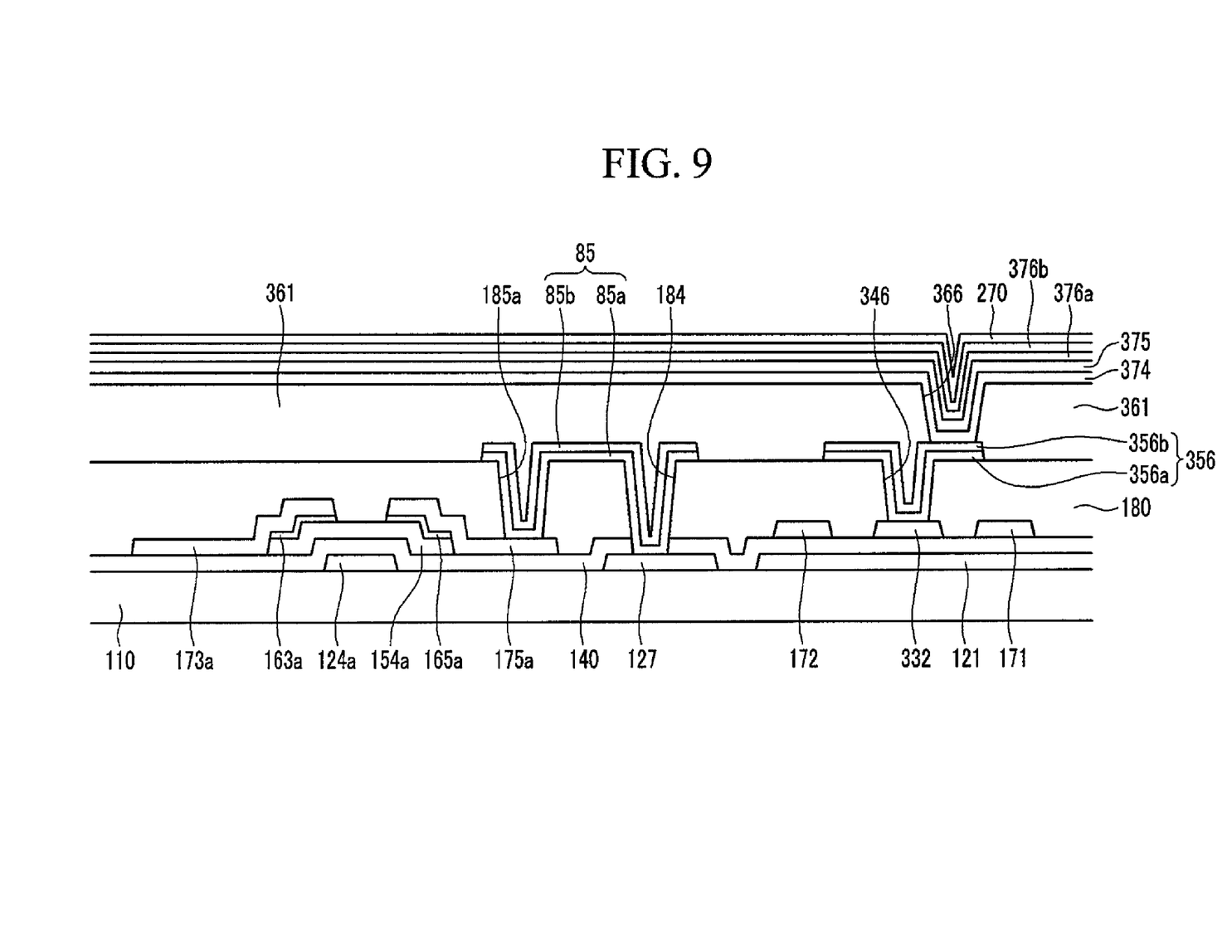

FIG. 8 to FIG. 9 are cross-sectional views of an organic light emitting device according to another exemplary embodiment of the present invention and taken along the line III-III of FIG. 2.

Most of the interlayer structure of the organic light emitting device shown in FIG. 8 and FIG. 9 is the same as that of the organic light emitting device shown in FIG. 6.

However, in the exemplary embodiment show in FIG. 8, the first electron injection layer 376a is formed on the whole surface of the substrate along with the electron transport layer 375 as well as the second electron injection layer 376b. Here, the first electron injection layer 376a may be made of the same material as that of the electron transport layer 375.

Furthermore, in an exemplary embodiment shown in FIG. 9, a hole injection layer 372 is formed on the whole surface of the substrate as well as the electron injection layer 376, and the electron transport layer 375. Here, the hole injection layer 372 may include at least one of an alkali metal such as Li, Cs, and Mg. Also, the hole injection layer 372 may include $C_{60}$ (fullerene) or NDN (a good produced by Novaled company) as the organic material. Here, it is preferable that the deposition speed ratio of the alkali metal or the organic material is in the range of 1-20%.

Also, although not shown, the hole transport layer 373 may be doped with the same material as the hole injection layer 372 and may be formed on the whole surface of the substrate.

When doping the hole transport layer 373 or the hole injection layer 372 with the impurity, the electron injection layer 376 or the electron transport layer 375 may have a different thickness to form the microcavity structure.

As above-described, in the exemplary embodiment shown in FIG. 6 to 9 of the present invention, the hole transport layer 373, the hole injection layer 372, the electron transport layer 375, or the electron injection layer 376 is doped with the impurity such that almost the same V-I curved line as that found with direct contact of the common electrode 270 and the contact assistants may be obtained.

The present invention may be applied to an organic light emitting device having a different structure.

According to an exemplary embodiment of the present invention, the common voltage line is formed and connected to the common electrode through the contact hole, thereby reducing the resistance of the common electrode.

Also, the auxiliary layer is thinly formed or the auxiliary layer including electrons or holes is doped with the impurity, and accordingly, even though they are disposed between the common electrode and the common voltage line, the current may flow between the common electrode and the common voltage line.

Accordingly, the process to form the contact hole exposing the common electrode in the auxiliary layer may be omitted, thereby simplifying the manufacturing process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
   a substrate;
   a first signal line and a second signal line formed on the substrate and intersecting each other;
   a common voltage line formed on the substrate, and intersecting one of the first signal line and the second signal line;
   a switching thin film transistor connected to the first signal line and the second signal line;
   a driving thin film transistor connected to the switching thin film transistor;
   an insulating layer covering the first signal line, the second signal line, the switching thin film transistor, and the driving thin film transistor;
   a pixel electrode formed on the insulating layer, and electrically connected to the driving thin film transistor;
   an organic light emitting member formed on the pixel electrode and including an emission layer and an auxiliary layer; and
   a common electrode formed on the organic light emitting member,
   wherein the auxiliary layer comprises a plurality of layers including electron transport/injection layers and hole transport/injection layers, and at least one layer of the auxiliary layer is disposed between the common voltage line and the common electrode to electrically connect the common voltage line and the common electrode.

2. The organic light emitting device of claim 1, further comprising:
   contact assistants formed on the insulating layer and directly contacting the common voltage line through a contact hole of the insulating layer; and
   a partition formed between the common electrode and the contact assistants and having a contact hole exposing the contact assistants,
   wherein the auxiliary layer for electrically connecting the common voltage line and the common electrode is also formed in the contact hole of the partition to be electrically connected to the contact assistants.

3. The organic light emitting device of claim 2, wherein the auxiliary layer for electrically connecting the common voltage line and the common electrode is formed entirely under the common electrode.

4. The organic light emitting device of claim 3, wherein:
the auxiliary layer comprises an electron injection layer, an electron transport layer, a hole transport layer, and a hole injection layer;
the thickness of the electron injection layer is in the range of 5-10 Å, and the electron injection layer comprises a first electron injection layer made of LiF; and
the auxiliary layer for electrically connecting the common voltage line and the common electrode comprises the first electron injection layer.

5. The organic light emitting device of claim 4, wherein:
the electron injection layer comprises a second electron injection layer including a metal oxide or an organic material having a deposition speed ratio of 1-20% of the electron injection layer; and
the auxiliary layer for electrically connecting the common voltage line and the common electrode comprises the second electron injection layer.

6. The organic light emitting device of claim 5, wherein:
the metal oxide comprises at least one of vanadium oxide ($V_2O_5$), tungsten oxide ($WO_3$) or molybdenum oxide ($MoO_3$), and the organic material is made of tetrafluoro-tetracyano-p-quinodimethane (F4-TCNQ).

7. The organic light emitting device of claim 5, wherein the hole injection layer comprises an alkali metal or an organic material having a deposition speed ratio of 1-20% of the hole injection layer, and the auxiliary layer for electrically connecting the common voltage line and the common electrode comprises the hole injection layer.

8. The organic light emitting device of claim 7, wherein:
the alkali metal is at least one of Li, Cs, and Mg; and
the organic material is $C_{60}$.

9. The organic light emitting device of claim 7, wherein the hole transport layer comprises an alkali metal or an organic material having a deposition speed ratio of 1-20% of the hole transport layer, the auxiliary layer for electrically connecting the common voltage line and the common electrode comprises the hole transport layer, and the electron transport layer has different thicknesses in a red emission region, a green emission region, and a blue emission region.

10. The organic light emitting device of claim 9, wherein:
the alkali metal is at least one of Li, Cs, and Mg; and
the organic material is $C_{60}$.

11. The organic light emitting device of claim 7, wherein the electron transport layer comprises a metal oxide or an organic material having a deposition speed ratio of 1-20% of the electron transport layer, the auxiliary layer for electrically connecting the common voltage line and the common electrode comprises the electron transport layer, and the hole transport layer has different thicknesses in a red emission region, a green emission region, and a blue emission region.

12. The organic light emitting device of claim 11, wherein:
the metal oxide comprises at least one of vanadium oxide ($V_2O_5$), tungsten oxide ($WO_3$) or molybdenum oxide ($MoO_3$); and
the organic material is made of tetrafluoro-tetracyano-p-quinodimethane (F4-TCNQ).

13. The organic light emitting device of claim 2, wherein the auxiliary layer comprises an electron transport layer, a hole transport layer, and a hole injection layer, and the hole injection layer comprises an alkali metal or an organic material having a deposition speed ratio of 1-20% of the hole transport layer, the auxiliary layer for electrically connecting the common voltage line and the common electrode comprises the hole injection layer.

14. The organic light emitting device of claim 13, wherein the hole transport layer comprises an alkali metal or an organic material having a deposition speed ratio of 1-20% of the hole transport layer, the auxiliary layer for electrically connecting the common voltage line and the common electrode comprises the hole transport layer, and the electron transport layer has different thicknesses in a red emission region, a green emission region, and a blue emission region.

15. The organic light emitting device of claim 13, wherein:
the electron transport layer comprises a metal oxide or an organic material having a deposition speed ratio of 1-20% of the electron transport layer, the auxiliary layer for electrically connecting the common voltage line and the common electrode comprises the electron transport layer, and the hole transport layer has different thicknesses in a red emission region, a green emission region, and a blue emission region.

16. The organic light emitting device of claim 2, wherein the auxiliary layer comprises an electron transport layer and a hole transport layer, the hole transport layer comprises an alkali metal or an organic material having a deposition speed ratio of 1-20% of the hole transport layer, the auxiliary layer for electrically connecting the common voltage line and the common electrode comprises the hole transport layer, and the electron transport layer has different thicknesses in a red emission region, a green emission region, and a blue emission region.

17. The organic light emitting device of claim 2, wherein the auxiliary layer comprises an electron transport layer and a hole transport layer, the electron transport layer comprises a metal oxide or an organic material having a deposition speed ratio of 1-20% of the electron injection layer, the auxiliary layer for electrically connecting the common voltage line and the common electrode comprises the electron transport layer, and the hole transport layer has different thicknesses in a red emission region, a green emission region, and a blue emission region.

18. The organic light emitting device of claim 1, wherein the pixel electrode comprises a transparent electrode made of a transparent conductive material and a reflecting electrode made of a reflective conductive material.

19. The organic light emitting device of claim 1, wherein the common electrode has a thickness of 50-100 Å.

* * * * *